(12) United States Patent
Kim et al.

(10) Patent No.: US 8,525,181 B2
(45) Date of Patent: Sep. 3, 2013

(54) THIN-FILM TRANSISTOR ARRAY SUBSTRATE, ORGANIC LIGHT-EMITTING DISPLAY DEVICE COMPRISING THE THIN-FILM TRANSISTOR ARRAY SUBSTRATE, AND METHOD OF MANUFACTURING THE THIN-FILM TRANSISTOR ARRAY SUBSTRATE

(75) Inventors: Sung Ho Kim, Yongin (KR); Min-Chul Shin, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 6 days.

(21) Appl. No.: 13/340,800

(22) Filed: Dec. 30, 2011

(65) Prior Publication Data

US 2013/0032804 A1 Feb. 7, 2013

(30) Foreign Application Priority Data

Aug. 4, 2011 (KR) .................. 10-2011-0077846

(51) Int. Cl.
*H01L 27/14* (2006.01)
*H01L 21/00* (2006.01)
*G02F 1/1343* (2006.01)

(52) U.S. Cl.
USPC .............. 257/72; 257/E33.053; 257/E33.064; 438/34; 349/38

(58) Field of Classification Search
CPC ... H01L 27/1214; H01L 27/12; H01L 27/153; H01L 29/66757; G02F 1/136213; G02F 1/136227; G02F 1/136286
USPC .............. 257/59, 71, 72, E33.053, E33.064; 438/28, 29, 34; 349/38, 42, 43
See application file for complete search history.

(56) References Cited

U.S. PATENT DOCUMENTS

| 2008/0055503 | A1* | 3/2008 | Cheng ............................ 349/38 |
| 2009/0061548 | A1* | 3/2009 | Cheng et al. .................... 438/22 |
| 2009/0278131 | A1* | 11/2009 | Kwon et al. .................... 257/72 |
| 2010/0045176 | A1* | 2/2010 | Kim et al. ..................... 313/504 |
| 2010/0193790 | A1 | 8/2010 | Yeo et al. |

FOREIGN PATENT DOCUMENTS

KR 10-2010-0088269 8/2010

* cited by examiner

*Primary Examiner* — Nikolay Yushin
(74) *Attorney, Agent, or Firm* — Lee & Morse, P.C.

(57) ABSTRACT

A thin-film transistor (TFT) array substrate includes an active layer on a substrate and a lower electrode of a capacitor on the same level as the active layer, a first insulation layer on the active layer and the lower electrode and having a first gap exposing an area of the lower electrode; a gate electrode of the TFT on the first insulation layer, and an upper electrode of the capacitor on the lower electrode and the first insulation layer, the upper electrode having a second gap that exposes the first gap and a portion of the first insulation layer; a second insulation layer disposed between the gate electrode and source electrode and drain electrodes, and not disposed on the upper electrode, in the first gap of the first insulation layer, or in the second gap of the lower electrode.

24 Claims, 10 Drawing Sheets

FIG. 11A (COMPARATIVE EXAMPLE)
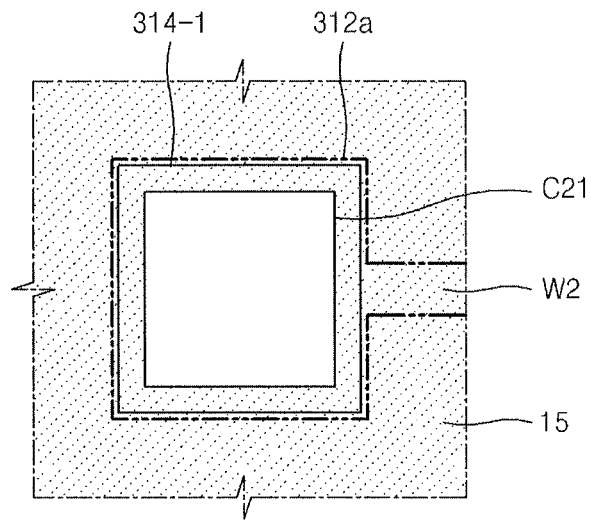
FIG. 11B (COMPARATIVE EXAMPLE)
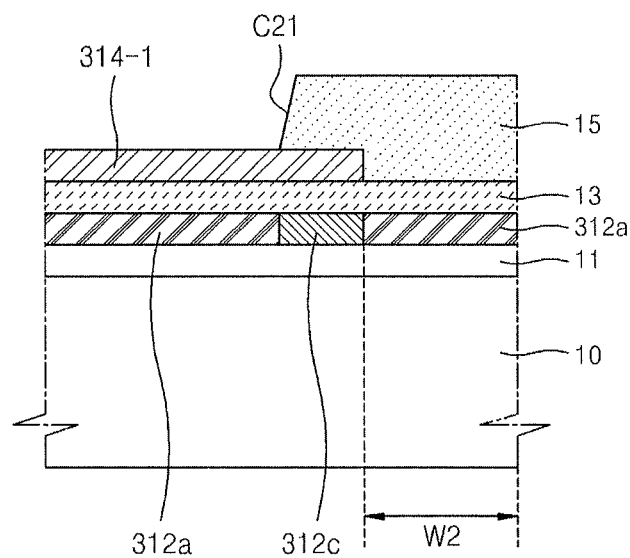

FIG. 12A (COMPARATIVE EXAMPLE)
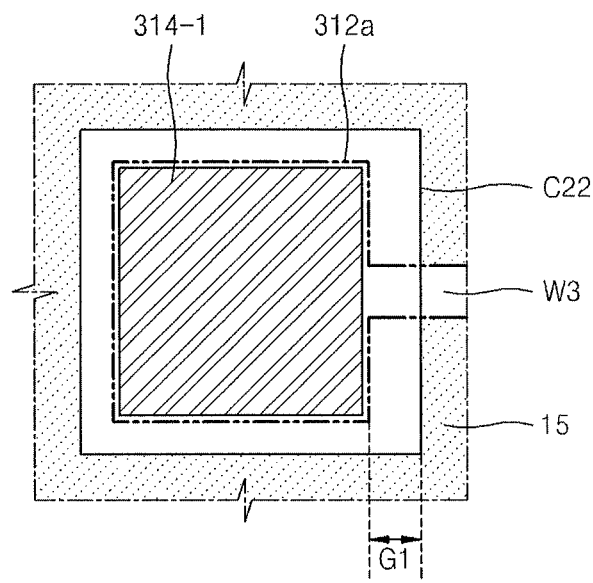
FIG. 12B (COMPARATIVE EXAMPLE)
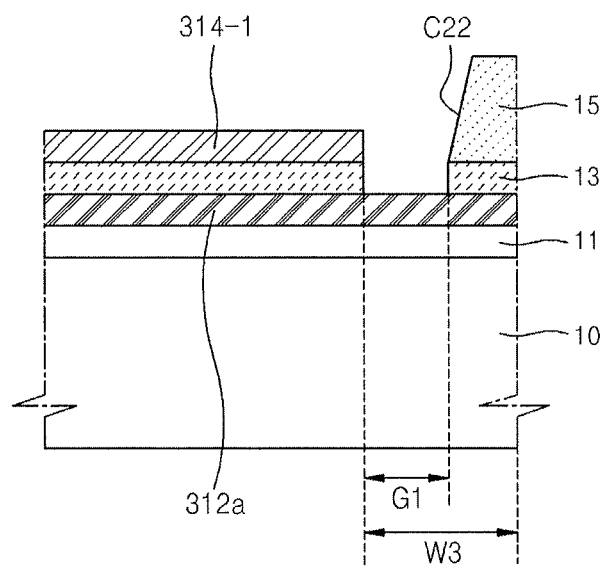

THIN-FILM TRANSISTOR ARRAY SUBSTRATE, ORGANIC LIGHT-EMITTING DISPLAY DEVICE COMPRISING THE THIN-FILM TRANSISTOR ARRAY SUBSTRATE, AND METHOD OF MANUFACTURING THE THIN-FILM TRANSISTOR ARRAY SUBSTRATE

CROSS-REFERENCE TO RELATED PATENT APPLICATION

This application claims the benefit of Korean Patent Application No. 10-2011-0077846, filed on Aug. 4, 2011, in the Korean Intellectual Property Office, the disclosure of which is incorporated herein in its entirety by reference.

BACKGROUND

1. Field

The present embodiments relate to a thin-film transistor (TFT) array substrate, an organic light-emitting display device including the TFT array substrate, and a method of manufacturing the TFT array substrate.

2. Description of the Related Art

Flat panel displays such as organic light-emitting display devices and liquid crystal displays (LCDs) include, for example, a thin-film transistor (TFT), a capacitor, and wiring that connects the TFT to the capacitor.

SUMMARY

According to an embodiment, there is provided a thin-film transistor (TFT) array substrate including an active layer of a TFT disposed on a substrate and a lower electrode of a capacitor disposed on a same level as the active layer, a first insulation layer disposed on the active layer and the lower electrode and having a first gap exposing an area of the lower electrode, a gate electrode of the TFT disposed on the first insulation layer, and an upper electrode of the capacitor disposed on the lower electrode and the first insulation layer, the upper electrode of the capacitor having a second gap that exposes the first gap and a portion of the first insulation layer, a source electrode and a drain electrode electrically connected to source and drain regions of the active layer, a second insulation layer disposed between the gate electrode and the source electrode and between the gate electrode and the drain electrode, wherein the second insulation layer is not disposed on the upper electrode of the capacitor, in the first gap of the first insulation layer, or in the second gap of the upper electrode, a pixel electrode connected to the source electrode or the drain electrode, and a third insulation layer that covers the source electrode and the drain electrode and exposes the pixel electrode.

The active layer and the lower electrode may include a semiconductor material doped with ion impurities.

The upper electrode may include a same material as a material used to form the pixel electrode.

The upper electrode and the pixel electrode may include a transparent conductive material.

The transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may be disposed on the second insulation layer.

The second insulation layer may include a hole by which the pixel electrode is exposed, and the pixel electrode may be disposed in the hole on the first insulation layer.

An etch rate of the source electrode and the drain electrode may be different from an etch rate of the upper electrode and the pixel electrode.

The third insulation layer may be disposed on the upper electrode, in the first gap of the first insulation layer, and in the second gap of the lower electrode.

The first insulation layer and the second insulation layer may be inorganic insulation layers.

The third insulation layer may be an organic insulation layer.

A wiring and a wiring connecting unit connected to the lower electrode on a same level as the lower electrode may be positioned at the lower electrode.

The wiring and the wiring connecting unit may include a semiconductor material doped with ion impurities.

According to an embodiment, there is provided an organic light-emitting display device including an active layer of a thin-film transistor (TFT) disposed on a substrate and a lower electrode of a capacitor disposed at a same level as the active layer on the substrate, a first insulation layer disposed on the active layer and the lower electrode and having a first gap exposing an area of the lower electrode, a gate electrode of the TFT disposed on the first insulation layer, and an upper electrode of the capacitor disposed on the lower electrode and the first insulation layer, the upper electrode of the capacitor having a second gap that exposes the first gap and a portion of the first insulation layer, a source electrode and a drain electrode electrically connected to source and drain regions of the active layer, a second insulation layer disposed between the gate electrode and the source electrode and between the gate electrode and the drain electrode, wherein the second insulation layer is not disposed on the upper electrode of the capacitor, in the first gap of the first insulation layer, or in the second gap of the upper electrode, a pixel electrode connected to the source electrode or the drain electrode, a third insulation layer that covers the source electrode and the drain electrode and exposes the pixel electrode, an organic emission layer disposed on the pixel electrode, and a counter electrode disposed on the organic emission layer.

The counter electrode may be a reflective electrode that reflects light emitted from the organic emission layer.

According to an embodiment, there is provided a method of manufacturing a TFT array substrate, the method including a first mask process of forming a semiconductor layer on a substrate and patterning the semiconductor layer to form an active layer of a TFT and a lower electrode of a capacitor, a second mask process of forming a first insulation layer, stacking a first metal on the first insulation layer, and patterning the first metal to form a gate electrode of the TFT and an etch stop layer of the capacitor with a first gap in an area of the lower electrode, a third mask process of forming a second insulation layer to have contact holes by which a source region and a drain region of the active layer are exposed and by which the etch stop layer and the first gap are exposed, a fourth mask process of forming a second metal on a result of the third mask process, patterning the second metal to form a source electrode and a drain electrode respectively connected to the source region and the drain region, and removing the first metal and the etch stop layer without removing the source and drain electrodes, and a fifth mask process of forming a third metal on a result of the fourth mask process and patterning the third metal to form a pixel electrode and to form an upper electrode on the first insulation layer, the upper electrode including a second gap that exposes the first insulating layer and the first gap, and a sixth mask process of forming a third insulation layer and patterning the third insulation layer to expose the pixel electrode.

In the first mask process, a wiring may be formed together with the lower electrode to be on a same level as the lower electrode at the lower electrode, by patterning the semiconductor layer.

After the second mask process, the source and drain regions and the wiring may be doped with ion impurities.

In the third mask process, when the second insulation layer is etched, the first insulation layer may also be etched to have the first gap.

The fourth mask process may include a first etch process of etching the second metal, and a second etch process of etching the etch stop layer.

In the fourth mask process, the second metal may be a same material as the etch stop layer, and the second metal and the etch stop layer may be simultaneously etched.

After the fourth mask process, the lower electrode may be doped with ion impurities.

In the fifth mask process, the pixel electrode may be formed on the second insulation layer at a same time that the upper electrode is formed.

In the third mask process, a hole may be formed in a portion of the first insulation layer that is outside the TFT. In the fifth mask process, the pixel electrode may be formed simultaneously with the upper electrode on the first insulation layer in the hole.

BRIEF DESCRIPTION OF THE DRAWINGS

The above and other features will become more apparent by describing in detail exemplary embodiments thereof with reference to the attached drawings in which:

FIGS. 11A and 11B are a schematic plan view and a schematic cross-sectional view, respectively, of a capacitor region of an organic light-emitting display device according to a comparative example;

FIGS. 12A and 12B are a schematic plan view and a schematic cross-sectional view, respectively, of a capacitor region of an organic light-emitting display device according to another comparative example;

DETAILED DESCRIPTION

The present embodiments will now be described more fully with reference to the accompanying drawings in which exemplary embodiments of the invention are shown.

Figure 1:
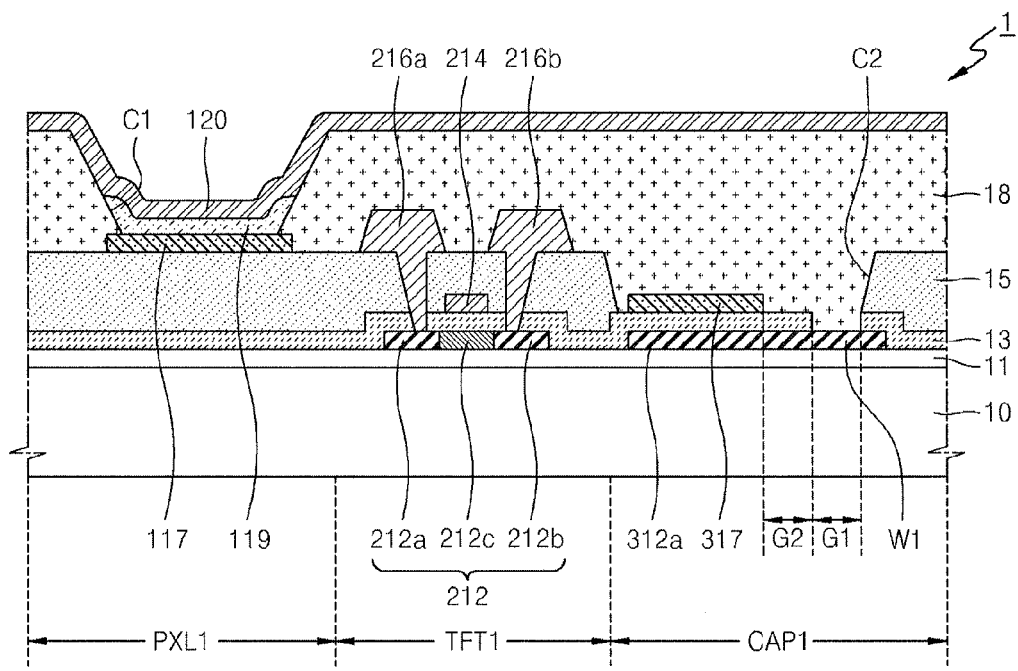
FIG. 1 is a schematic cross-sectional view of an organic light-emitting display device according to an embodiment.

FIG. 1 is a schematic cross-sectional view of an organic light-emitting display device 1 according to an embodiment.

Referring to FIG. 1, the organic light-emitting display device 1 may include, on a substrate 10, a pixel region PXL1 including an emission layer 119, a transistor region TFT1 including a thin-film transistor (TFT), and a capacitor region CAP1 including a capacitor.

In the transistor region TFT1, an active layer 212 of the TFT may be formed on the substrate 10, with a buffer layer 11 between the active layer 212 and the substrate 10. The active layer 212 may be formed of a semiconductor including amorphous silicon or polycrystalline silicon and may include a channel region 212*c* between a source region 212*a* and a drain region 212*b* that are doped with ion impurities.

A first insulation layer 13 as a gate insulation layer may be formed on the buffer layer 11 to cover the active layer 212. A gate electrode 214 may be formed on the first insulation layer 214 to face the channel region 212*c* of the active layer 212.

A second insulation layer 15 as an interlayer insulating layer may be formed on the first insulation layer 214 to cover the gate electrode 214. A source electrode 216*a* and a drain electrode 216*b* may be formed on the second insulation layer 15 to contact the source region 212*a* and the drain region 212*b*, respectively, of the active layer 212.

A third insulation layer 18 may be formed on the second insulation layer 15 to cover the source electrode 216*a* and the drain electrode 216*b*.

The first insulation layer 13 and the second insulation layer 15 may be inorganic insulation layers. The third insulation layer 18 may be an organic insulation layer. The third insulation layer 18 may include a commercial polymer such as polymethyl methacrylate (PMMA) or polystyrene (PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

In the pixel region PXL1, a pixel electrode 117, which may be formed of the same material as that used to form an upper electrode 317 of the capacitor (described below), may be formed on the second insulation layer 15. The second insulation layer 15 may be formed on the first insulation layer 13. The first insulation layer may be formed on the buffer layer 11.

The pixel electrode 117 may be formed of a transparent conductive material so that light emits via the pixel electrode 117. Examples of the transparent conductive material may include at least one of indium tin oxide (ITO), indium zinc oxide (IZO), zinc oxide (ZnO), indium oxide (In$_2$O$_3$), indium gallium oxide (IGO), and aluminum zinc oxide (AZO).

The emission layer 119 may be formed on the pixel electrode 117. Light produced from the organic emission layer 119 may be emitted toward the substrate 10 via the pixel electrode 117, which may be formed of a transparent conductive material.

The buffer layer 11, the first insulation layer 13, and the second insulation layer 15, which are below the pixel electrode 117, may be alternately formed of materials having different refractive indices to function as a distributed Bragg reflector (DBR). Thus, the efficiency of light emitted by the organic emission layer 119 may be improved. The buffer layer 11, the first insulation layer 13, and the second insulation layer 15 may each be formed of SiO$_2$, SiN$_x$, or the like. Although the buffer layer 11, the first insulation layer 13, and the second insulation layer 15 are each shown as single layers in FIG. 1, each of the buffer layer 11, the first insulation layer 13, and the second insulation layer 15 may also be formed of a plurality of layers.

The third insulation layer 18 may be formed on edges of the pixel electrode 117. A first hole C1 may be formed in the third insulation layer 18 to expose a portion of the pixel electrode 117. The organic emission layer 119 may be included in the first hole C1 of the third insulation layer 18.

The organic emission layer 119 may be formed of a low-molecular weight organic material or a high molecular weight organic material. When the organic emission layer 119 is formed of a low molecular weight organic layer, a hole injection layer (HIL), a hole transport layer (HTL), an emission layer (EML), an electron transport layer (ETL), an electron injection layer (EIL), and the like may be stacked around the organic emission layer 119. Various other layers may be stacked if desired. Examples of organic materials that may be used to form the organic emission layer 119 include any of various materials such as copper phthalocyanine (CuPc), N-di(naphthalene-1-yl)-N,N'-diphenyl-benzidine (NPB), and tris-8-hydroxyquinoline aluminum (Alq3).

When the organic emission layer 119 is formed of a high molecular weight organic material, an HTL may be provided in addition to the organic emission layer 119. The HTL may be formed of poly-(3,4)-ethylene-dihydroxy thiophene (PEDOT), polyaniline (PANI), or the like. In this case, examples of organic materials that may be used to form the organic emission layer 119 include high molecular weight organic materials, such as polyphenylene vinylenes (PPVs) and polyfluorenes.

A counter electrode 120 may be formed as a common electrode on the organic emission layer 119. According to the present embodiment, the pixel electrode 117 may be used as an anode electrode and the counter electrode 120 may be used as a cathode electrode. It is also possible for the pixel electrode 117 to be used as a cathode electrode and the counter electrode 120 to be used as an anode electrode.

The counter electrode 120 may be a reflective electrode including a reflective material. The opposite electrode 120 may include at least one of aluminum (Al), magnesium (Mg), lithium (Li), calcium (Ca), lithium fluoride/calcium (LiF/Ca), and lithium fluoride/aluminum (LiF/Al).

The counter electrode 120 may be a reflective electrode. Accordingly, light emitted from the organic emission layer 119 may be reflected by the counter electrode 120 and may be emitted toward the substrate 10 via the pixel electrode 117, which may be formed of a transparent conductive material.

In the capacitor region CAP1, a lower electrode 312*a* of the capacitor, which may be formed of the same material as the active layer 212 of the TFT, a wiring region W1 connected to the lower electrode 312*a*, an upper electrode 317 of the capacitor, which may be formed of the same material as the pixel electrode 117, and the first insulation layer 13 as a dielectric layer between the lower electrode 312*a* and the upper electrode 317 may be formed on the substrate 10 and the buffer layer 11.

The lower electrode 312*a* of the capacitor may include a semiconductor doped with ion impurities, which may be the same material as that used to form the source region 212*a* and the drain region 212*b* of the active layer 212 of the TFT. If the lower electrode 312*a* is formed of an intrinsic semiconductor undoped with ion impurities, the capacitor together with the upper electrode 317 forms a metal oxide semiconductor (MOS) capacitor (CAP) structure. However, when the lower electrode 312*a* of the capacitor is formed of a semiconductor doped with ion impurities, as in the present embodiment, the capacitor together with the upper electrode 317 forms a metal-insulator-metal (MIM) CAP structure, and thus an electrostatic capacitance may be maximized. Accordingly, because the MIM CAP structure can obtain the same electrostatic capacitance as the MOS CAP structure although having a smaller area than the MOS CAP structure, the pixel electrode 117 may be formed to be larger, on account of the reduction of the area of the capacitor. Thus, an aperture ratio may be increased.

The wiring region W1 may be disposed at a region of, or adjacent to, the lower electrode 312*a* to be on the same level as the lower electrode 312*a* and to be connected to the lower electrode 312*a* to transmit a signal (current/voltage) to the lower electrode 312. The wiring region W1 may include a semiconductor doped with ion impurities, similar to the lower electrode 312*a*.

The first insulation layer 13 may be present on the lower electrode 312*a*, but may be absent from a portion of a region of the lower electrode 312*a*. The region on which the first insulation layer 13 is not formed may be a part of the wiring region W1. In detail, the region on which the first insulation layer 13 is not formed may be a connecting unit where the lower electrode 312*a* is connected to the wiring region W1 that connects the lower electrode 312*a* to the wiring region W1. Although it is illustrated in the present embodiment that the region on which the first insulation layer 13 is not formed is a part of the wiring region W1, the region on which the first insulation layer 13 is not formed may also be an edge of the lower electrode 312*a* instead of the wiring region W1. A boundary between the lower electrode 312*a* and the wiring region W1 may not be clearly designated in the capacitor region CAP1.

According to the present embodiment, the first insulation layer 13 defines a first gap G1 on an area in the wiring region W1 that exposes an area of the lower electrode 312*a*. The lower electrode 312*a* may have a portion where the first insulation layer 13 is not formed. The first insulation layer 13 may be also etched until the wiring region W1 is exposed in the wiring region W1 when the second insulation layer 15 is etched, as will be described below.

The upper electrode 317 may be formed on an upper surface of the first insulation layer 13. The upper electrode 317 may be formed of the same material as that used to form the pixel electrode 117. If the pixel electrode 117 includes a transparent conductive material, the upper electrode 317 may also include a transparent conductive material.

The upper electrode 317 may be separated from the first gap 01 of the first insulation layer 13 by a second gap G2.

The second insulation layer 15 may be formed on an upper surface of the first insulation layer 13 and may include a second hole C2 through which the upper electrode 317, the first insulation layer 13 having the first gap G1, and the second insulation layer 15 having the second gap G2 are exposed.

The third insulation layer 18 may be formed on the second insulation layer 15. The third insulation layer 18 may be an organic insulation layer. The third insulation layer 18 including an organic insulation material having low permittivity may be interposed between the counter electrode 120 and the upper electrode 317. Accordingly, parasitic capacitance that may be formed between the counter electrode 120 and the upper electrode 317 may be reduced, and thus, signal disturbance due to the parasitic capacitance may be prevented.

Figure 2:
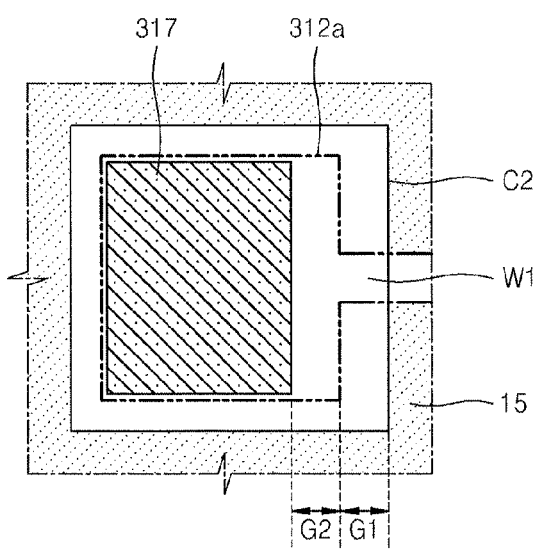
FIG. 2 is a schematic plan view of a capacitor region of the organic light-emitting display device illustrated in FIG. 1.

FIG. 2 is a schematic plan view of the capacitor region CAP1 of the organic light-emitting display device 1 illustrated in FIG. 1.

Referring to FIG. 2, the second hole C2, through which the upper electrode 317, the first insulation layer 13 having the first gap G1, and the second insulation layer 15 having the second gap G2 are exposed, may be formed in the second insulation layer 15. The second hole C2 may expose not only a part of the wiring region W1 but also an area around the upper electrode 317.

The lower electrode 312a and the wiring region W1 connected to the lower electrode 312a on the same level may have different regions where ion impurities are doped, according to the size of the second hole C2 of the second insulation layer 15. According to a comparative embodiment, the semiconductor material of the connecting unit may not be doped with ions in an area of the connecting unit between the lower electrode 312a and the wiring region W1. In this case, the area where the ion doping does not occur may have high resistance. Accordingly, a capacitor capacitance may decrease, or the quality of signal transmission may degrade. However, in the present embodiment, the second hole C2 may have a larger size than the upper electrode 317. Accordingly, both the lower electrode 312a and the wiring region W1 may be doped with ion impurities. Ion doping may occur in the entire area between the lower electrode 312a and the wiring region W1. Accordingly, the capacitor capacitance may be increased and the quality of signal transmission may be improved.

The upper electrode 317 may be offset by a distance of the second gap G2 from the first gap G1 of the first insulation layer 13. Accordingly, a silicon-metal compound formed around the lower electrode 312a (described below) may prevent generation of leakage current between the lower electrode 312a and the upper electrode 312.

As described above, in the organic light-emitting display device 1 according to the present embodiment, the first insulation layer 13 of the capacitor may have an area where no insulation layer is formed. The area where no insulation layer is formed may have a size corresponding to the first gap G1, on a region of the lower electrode 312a. Accordingly, ion doping may occur in the entire area between the lower electrode 312a and the wiring region W1, and thus signal transmission of the capacitor may be improved. In addition, the upper electrode 317 may be separated by the first gap G1 and further the second gap G2. Accordingly, the silicon-metal compound may prevent generation of leakage current between the lower electrode 312a and the upper electrode 317.

A method of manufacturing the organic light-emitting display device 1 will now be described with reference to FIGS. 3-10.

Figure 3:
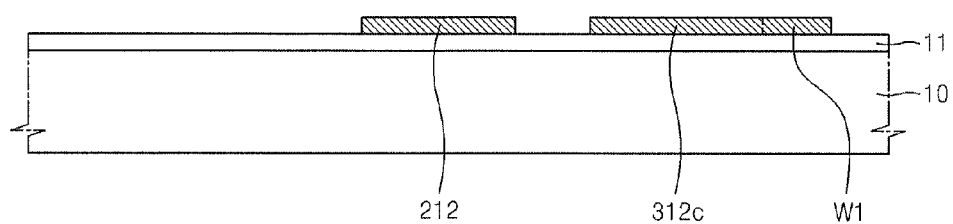
FIG. 3 is a schematic cross-sectional view illustrating a result of a first mask process of the organic light-emitting display device illustrated in FIG. 1.

FIG. 3 is a schematic cross-sectional view illustrating a result of a first mask process of the organic light-emitting display device 1.

Referring to FIG. 3, the active layer 212 of the TFT and a preliminary (undoped) lower electrode 312c of the capacitor may be formed on a substrate 10 having a buffer layer 11 formed thereon. In the first mask process, the wiring region W1 of the capacitor may also be formed together with the preliminary lower electrode 312c such that the wiring region W1 and the preliminary lower electrode 312c are connected.

The substrate 10 may be formed of a transparent glass material containing $SiO_2$ as a main component. Alternatively, the substrate 10 may be a plastic substrate including polyethylene terephthalate (PET), polyethylene naphthalate (PEN), polyimide, or the like.

The buffer layer 11 including $SiO_2$ and/or $SiN_x$ may be formed on the substrate 10 in order to secure the smoothness of the substrate 10 and to prevent penetration of impurity elements into the substrate 10.

Although not shown in FIGS. 3-10, a semiconductor layer (not shown) may be formed on the buffer layer 11, a photoresist (not shown) may be coated on the semiconductor layer, and the semiconductor layer may be patterned by photolithography using a first photomask (not shown), thereby simultaneously forming the active layer 212 of the TFT, a preliminary lower electrode 312c of the capacitor, and a capacitor wiring (not shown).

The first mask process based on photolithography may be performed via a series of processes such as exposure by using the first photomask and an exposer (not shown), developing, etching, and either stripping or ashing.

The semiconductor layer may be formed of amorphous silicon or polycrystalline silicon. The polycrystalline silicon may be formed by crystallizing amorphous silicon. Amorphous silicon may be crystallized using any of various methods such as rapid thermal annealing (RTA), solid phase crystallization (SPC), excimer laser annealing (ELA), metal-induced crystallization (MIC), metal-induced lateral crystallization (MILC), and sequential lateral solidification (SLS).

Figure 4:
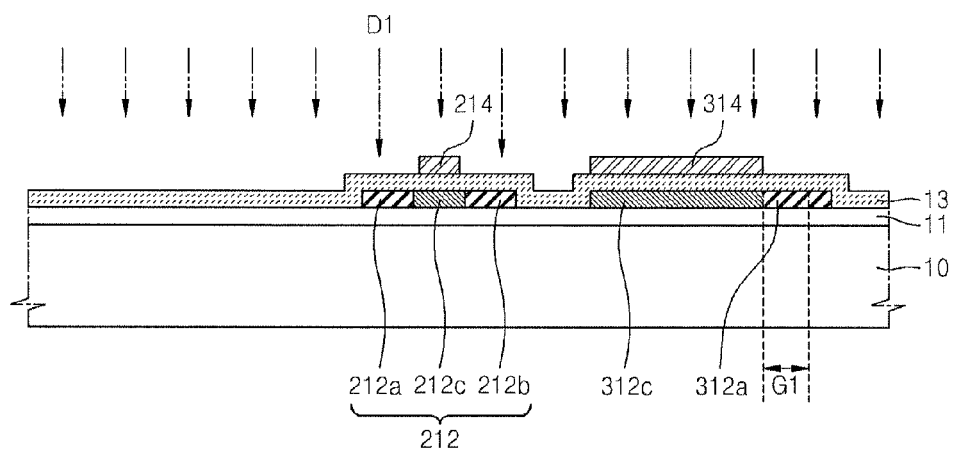
FIG. 4 is a schematic cross-sectional view illustrating a result of a second mask process of the organic light-emitting display device illustrated in FIG. 1.

FIG. 4 is a schematic cross-sectional view illustrating a result of a second mask process of the organic light-emitting display device 1.

Referring to FIG. 4, a first insulation layer 13 may be stacked on a result of the first mask process of FIG. 3, and a layer (not shown) including a first metal may be formed on the first insulation layer 13 and patterned.

As a result of the patterning, the gate electrode 214 including the first metal may be formed on the first insulation layer 13 in the transistor region TFT1. At the same time an etch stop layer 314 of the capacitor, including the first metal, may be formed on the first insulation layer 13 in the capacitor region CAP1.

The first insulation layer 13 may be a single layer or multiple layers of $SiO_2$, $SiN_x$, or the like. The first insulation layer 13 may function as a gate insulation layer of the TFT and a dielectric layer of the capacitor.

The gate electrode 214 and the etch stop layer 314 may be formed of at least one low-resistance metal selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu) in a single- or multi-layered structure.

The resultant structure may be doped with ion impurities. The ion impurities may be B or P ions, and the active layer 212 of the TFT and the wiring region W1 of the capacitor may be doped with the B or P ions at a concentration of $1 \times 10^{15}$ atoms/cm$^2$ or higher, as indicated by D1, which refers to a first doping process.

The active layer 212 may be doped with ion impurities by using the gate electrode 214 as a self-alignment mask, thereby obtaining the source and drain regions 212a and 212b doped with ion impurities and the channel region 212c therebetween.

The preliminary lower electrode 312c, which may be foamed of the same material as the active layer 212, is doped with ion impurities, similar to the channel region 212c, because the etch stop layer 314 serves a blocking mask. However, the wiring region W1 having no etch stop layer 314 formed thereon may be doped with ion impurities. Accordingly, the etch stop layer 314 may have substantially the same size as that of the preliminary lower electrode 312c, and is not disposed over the wiring region W1.

Figure 5:
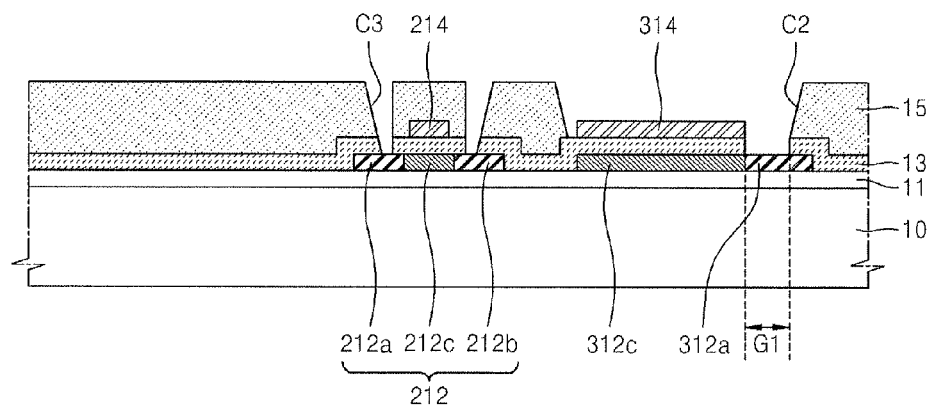
FIG. 5 is a schematic cross-sectional view illustrating a result of a third mask process of the organic light-emitting display device illustrated in FIG. 1.

FIG. 5 is a schematic cross-sectional view illustrating a result of a third mask process of the organic light-emitting display device 1.

Referring to FIG. 5, the second insulation layer 15 may be stacked on a result of the second mask process of FIG. 4 and patterned to form the second hole C2 through which the entire etch stop layer 314 is exposed, and third holes C3 through which the source region 212a and the drain region 212b of the active layer 212 may be partially exposed.

The second hole C2 may expose the etch stop layer 314 and the first gap G1 of the first insulation layer 13. When the second insulation layer 15 is etched, the first insulation layer 13 may also be etched. Accordingly, a portion of the first insulation layer 13 that is below the etch stop layer 314 is not etched, and a portion of the first insulation layer 13 not covered by the etch stop layer 314 or a portion of the first insulation layer 13 on the wiring region W1 may be etched. In other words, the etch stop layer 314 functions as an etch stop layer for stopping etching of the first insulation layer 13 with respect to the second insulation layer 15.

The third holes C3 may expose a part of the source region 212a and a part of the drain region 212b.

Figure 6:
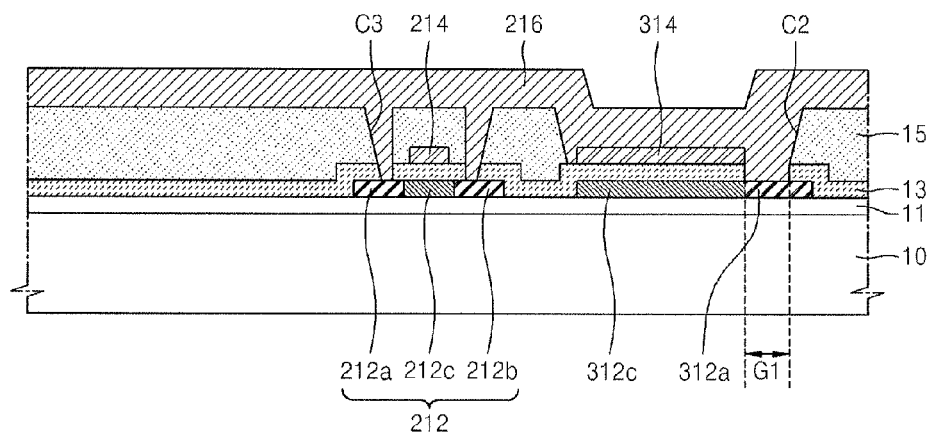
FIGS. 6-8 are schematic cross-sectional views illustrating a fourth mask process of the organic light-emitting display device illustrated in FIG. 1.
Figure 7:
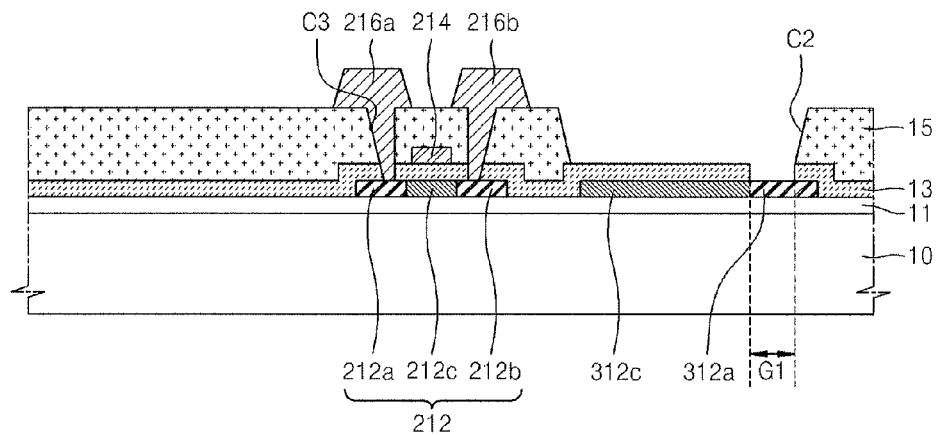
Figure 8:
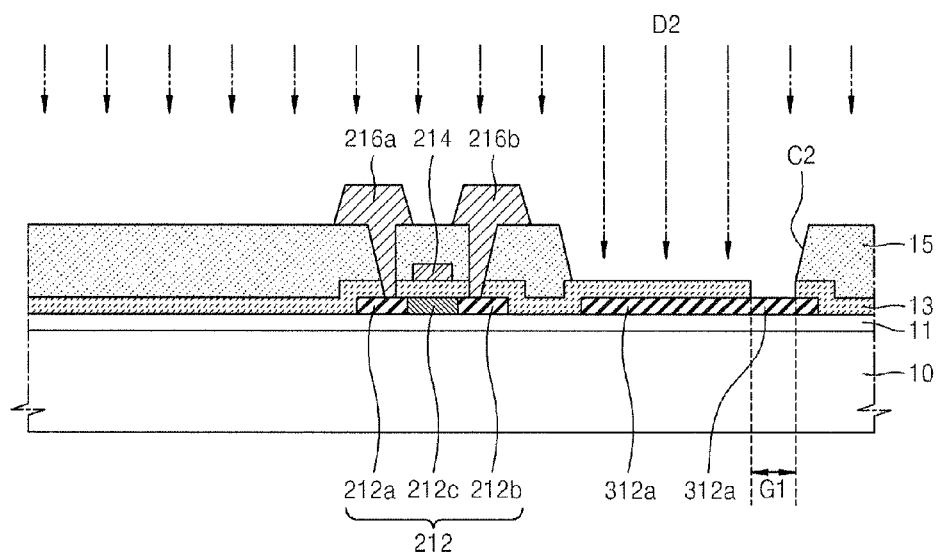

FIGS. 6-8 are schematic cross-sectional views illustrating a fourth mask process of the organic light-emitting display device 1.

FIG. 6 illustrates a situation where a second metal 216 is formed on a result of the third mask process of FIG. 5. The second metal 216 may be stacked on the etch stop layer 314 and may fill the second hole C2 and the third holes C3.

The second metal 216 may be formed of at least one of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu) in a single- or multi-layered structure.

The second metal 216 may directly contact the wiring region W1 corresponding to the first gap G1 where the first insulation layer 13 is not formed. A silicon-metal compound such as a silicide may be generated.

Although not shown in FIG. 6 in detail, a photoresist (not shown) may be formed on the second metal 216, and the fourth mask process may be conducted using a predetermined photomask (not shown).

FIG. 7 schematically illustrates a result of the fourth mask process. Referring to FIG. 7, the second metal 216 may be patterned to form the source electrode 216a and the drain electrode 216b on the second insulation layer 15. The etch stop layer 314 may be removed.

When the second metal 216, which is used to form the source and drain electrodes 216a and 216b, is the same as a metal used to form the etch stop layer 314, the etch stop layer 314 may be removed and the source and drain electrodes 216a and 216b may be formed, according to a single etch process by using a single etching solution. On the other hand, when the metal used to form the etch stop layer 314 and the second metal 216 are different materials, the second metal 216 may be etched using a first etching solution to form the source and drain electrodes 216a and 216b, and the etch stop layer 314 may be removed using a second etching solution. In this case, the silicon-metal compound formed in the wiring region W1 on which the first insulation layer 13 is not formed and which corresponds to the first gap G1 may not be removed and may remain.

FIG. 8 schematically illustrates a second doping process D2 after the fourth mask process.

Referring to FIG. 8, after the etch stop layer 314 is removed, the preliminary lower electrode 312c may be doped with B or P ions as ion impurities at an appropriate concentration in the second doping process D2.

The preliminary lower electrode 312c not doped during the first doping process D1 turns into the lower electrode 312a doped with ion impurities after the second doping process D2. Thus, the conductivity of the lower electrode 312a increases. Therefore, the electrostatic capacitance of the capacitor may be increased.

The second hole C2 of the second insulation layer 15 may have a larger size than the etch stop layer 314. Accordingly, both the lower electrode 312a and the wiring region W1 may be doped with ion impurities. Reduction of the electrostatic capacitance or degradation of signal transmission may be prevented.

Figure 9:
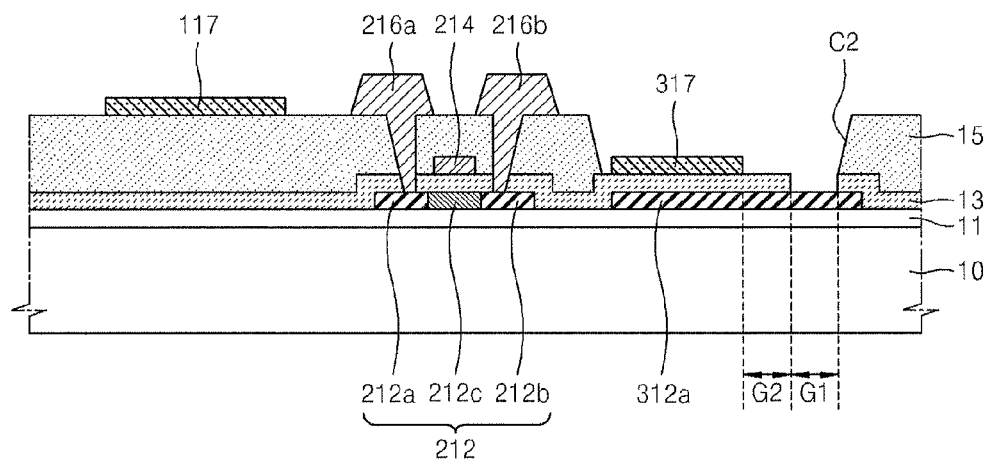
FIG. 9 is a schematic cross-sectional view illustrating a fifth mask process of the organic light-emitting display device illustrated in FIG. 1.

FIG. 9 is a schematic cross-sectional view illustrating a fifth mask process of the organic light-emitting display device 1.

Referring to FIG. 9, the pixel electrode 117 and the upper electrode 317 may be simultaneously formed of the same material on the result of the fourth mask process according to an identical mask process.

The pixel electrode 117 may be formed on the second insulation layer 15, and the upper electrode 317 may be formed on a portion of the first insulation layer 13 that exists within the second hole C2 of the capacitor region.

The upper electrode 317 may be spaced from the first gap G1 of the first insulation layer 13 by the second gap G2, in order to prevent leakage current from occurring due to a short between the upper electrode 317 and the silicon-metal compound formed in the wiring region W1 corresponding to the first gap G1 where the first insulation layer 13 is not formed.

Figure 10:
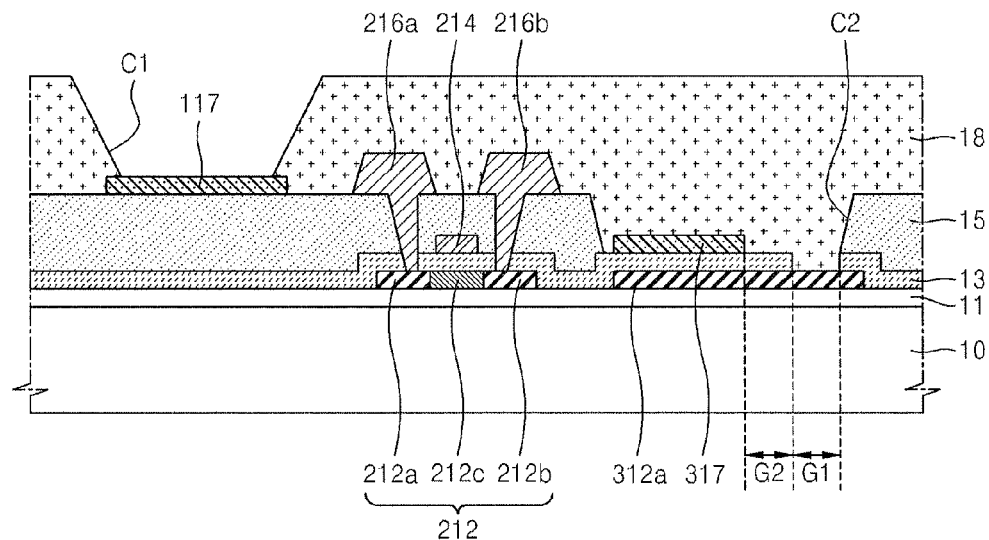
FIG. 10 is a schematic cross-sectional view illustrating a sixth mask process of the organic light-emitting display device illustrated in FIG. 1.

FIG. 10 is a schematic cross-sectional view illustrating a sixth mask process of the organic light-emitting display device illustrated 1.

Referring to FIG. 10, the third insulation layer 18 may be patterned to form the first hole C1 through which the upper surface of the pixel electrode 117 is exposed.

The first hole C1 may function to define an emission region and also to prevent a short between the pixel electrode 117 and the counter electrode 120 by preventing concentration of an electrical field on the edge of the pixel electrode 117 by increasing an interval between the edge of the pixel electrode 117 and the counter electrode 120 (see FIG. 1).

FIGS. 11A and 11B are a schematic plan view and a schematic cross-sectional view, respectively, of a capacitor region of an organic light-emitting display device according to a comparative example.

Referring to FIGS. 11A and 11B, a lower electrode 312a and an upper electrode 314-1 of a capacitor are disposed in the capacitor region, and a first insulation layer 13 as a dielectric layer is formed between the lower electrode 312a and the upper electrode 314-1. The upper electrode 314-1 is formed on a portion of the first insulation layer 13 that faces the lower electrode 312a, and a second insulation layer 15 is formed on the upper electrode 314-1.

In the present comparative example, the second insulation layer 15 does not expose the entire region of the upper electrode 314-1 and covers an edge part of the upper electrode 314-1. Accordingly, a region 312c undoped with ion impurities may be formed between the lower electrode 312a and a wiring region W2 by the second insulation layer 15 covering the upper electrode 314-1. In this case, the region 312c undoped with ion impurities may have a high resistance. Accordingly, a capacitor capacitance may decrease or the quality of signal transmission may degrade.

FIGS. 12A and 12B are a schematic plan view and a schematic cross-sectional view, respectively, of a capacitor region of an organic light-emitting display device according to another comparative example.

Referring to FIGS. 12A and 12B, the lower electrode 312a and the upper electrode 314-1 of a capacitor are disposed in the capacitor region, and a first insulation layer 13 as a dielectric layer is formed between the lower electrode 312a and the upper electrode 314-1. The upper electrode 314-1 is formed on a portion of the first insulation layer 13 that faces the lower electrode 312a, and the second insulation layer 15 is formed on the upper electrode 314-1.

In the present comparative example, the first insulation layer 13 has a first gap G1 where no insulation layer is formed, on the lower electrode 312a and a wiring region W3, but the upper electrode 314-1 is not separated from the first gap G1 of the first insulation layer 13 and lies from an etched surface of the first insulation layer 13. Accordingly, a silicon-metal compound formed in the first gap G1 may cause leakage current to occur between the upper electrode 314-1 and the lower electrode 312a.

An organic light-emitting display device 2 according to another embodiment will now be described with reference to FIGS. 13-17. The present embodiment will now be described by focusing on differences between the present embodiment and the previous embodiment.

Figure 13:
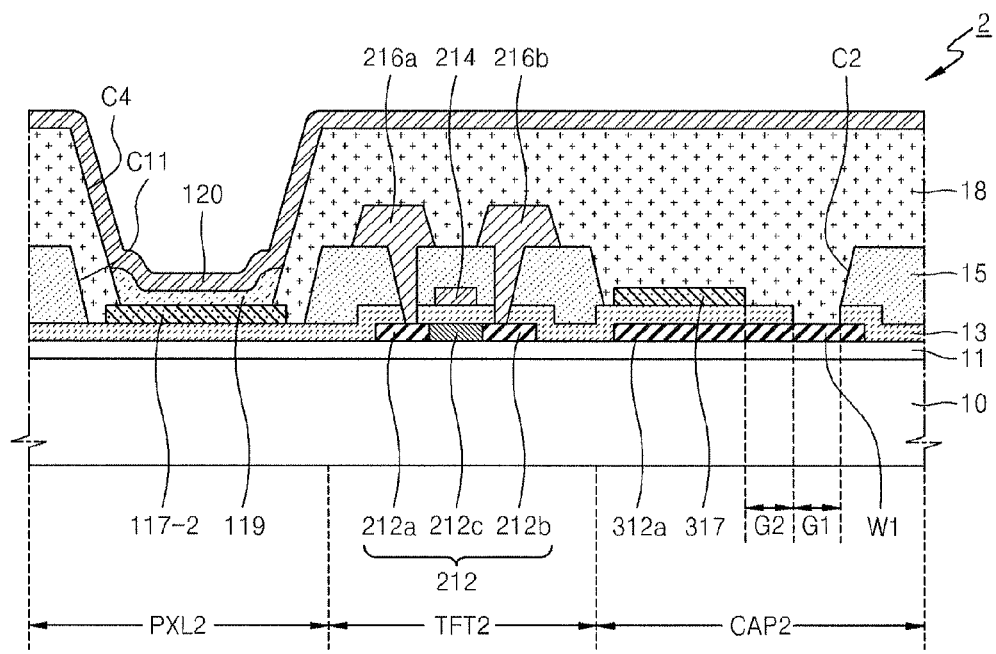
FIG. 13 is a schematic cross-sectional view of an organic light-emitting display device according to another embodiment.

FIG. 13 is a schematic cross-sectional view of the organic light-emitting display device 2 according to another embodiment.

Referring to FIG. 13, the organic light-emitting display device 2 may include, on a substrate 10, a pixel region PXL2 including an organic emission layer 119, a transistor region TFT2 including a TFT, and a capacitor region CAP2 including a capacitor. The transistor region TFT2 and the capacitor region CAP2 may be the same as those of the organic light-emitting display device 1 according to the previous embodiment.

In the pixel region PXL2, a pixel electrode 117-2, which may be formed of the same material as that used to form the upper electrode 317 of the capacitor, may be formed on the substrate 10, the buffer layer 11, and the first insulation layer 13.

In a bottom-emission type organic light-emitting display, the pixel electrode 117-2 may be a transparent electrode and the counter electrode 120 may be a reflective electrode. The organic emission layer 119 may be formed on the pixel electrode 117-2, and light produced from the organic emission layer 119 may be emitted toward the substrate 10 via the pixel electrode 117-2, which may be formed of a transparent conductive material.

Compared with the previous embodiment, in the organic light-emitting display device 2 according to the present embodiment, a second insulation layer 15 is not below the pixel electrode 117-2, and only the buffer layer 11 and the first insulation layer 13 are therebelow. The buffer layer 11 and the first insulation layer 13 may be alternately formed of materials having different refractive indices to function as a DBR.

Thus, the efficiency of light emitted by the organic emission layer 119 may be improved. However, although the efficiency of light may be increased due to the DBR, white angle dependency (WAD) may be degraded if the second insulation layer 15 is present. As compared with the previous embodiment, in the present embodiment, there may be no second insulation layer 15 between the pixel electrode 117-2 and the substrate 10. Accordingly, degradation of WAD may be prevented.

A method of manufacturing the organic light-emitting display device 2 will now be described with reference to FIGS. 14-17. A first mask process and a second mask process of the present embodiment may be the same as those of the previous embodiment. The present embodiment will now be described by focusing on the difference between the present embodiment and the previous embodiment.

Figure 14:
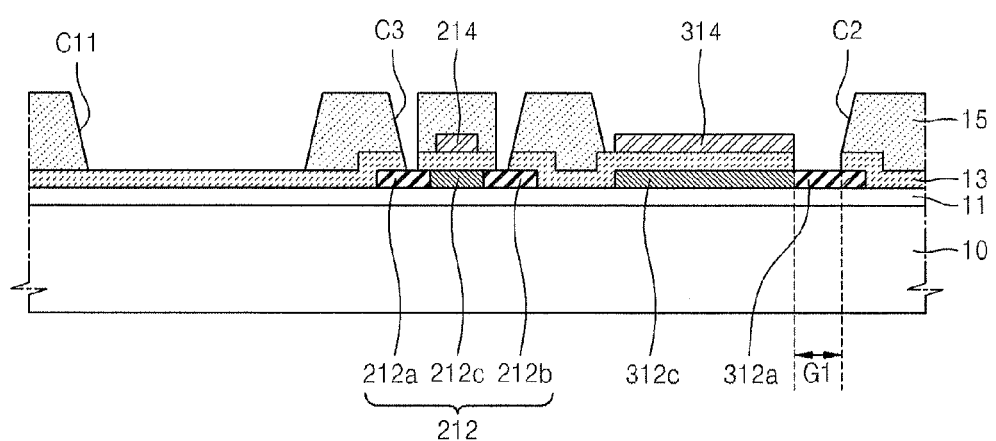
FIG. 14 is a schematic cross-sectional view illustrating a result of a third mask process of the organic light-emitting display device illustrated in FIG. 13.

FIG. 14 is a schematic cross-sectional view illustrating a result of a third mask process of the organic light-emitting display device 2.

Referring to FIG. 14, the second insulation layer 15 may be stacked on a result of the second mask process of FIG. 4 and patterned to form a first hole C11, a second hole C2 through which the entire etch stop layer 314 may be exposed, and third holes C3 through which the source region 212a and the drain region 212b of the active layer 212 may be partially exposed.

Figure 15:
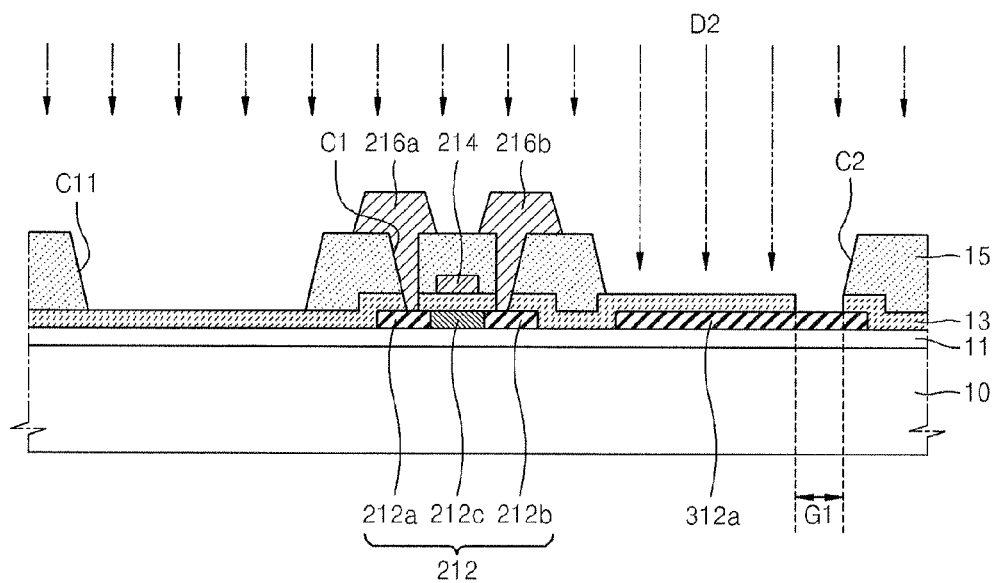
FIG. 15 is a schematic cross-sectional view illustrating a result of a fourth mask process of the organic light-emitting display device illustrated in FIG. 13.

FIG. 15 is a schematic cross-sectional view illustrating a result of a fourth mask process of the organic light-emitting display device 2.

Referring to FIG. 15, the source electrode 216a and the drain electrode 216b may be formed on the second insulation layer 15, and the etch stop layer 314 may be removed. After the etch stop layer 314 is removed, the preliminary lower electrode 312c may be doped with B or P ions as ion impurities at an appropriate concentration, in the second doping process D2 to form the lower electrode 312a.

Figure 16:
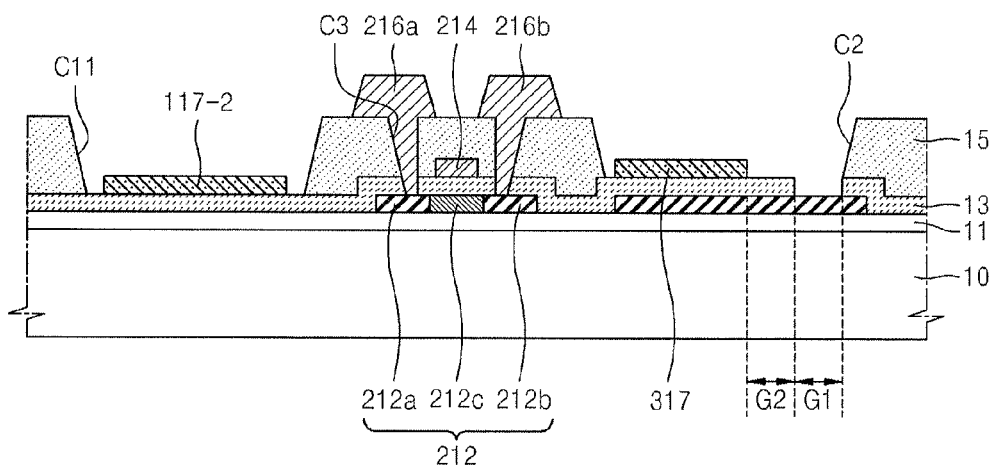
FIG. 16 is a schematic cross-sectional view illustrating a fifth mask process of the organic light-emitting display device illustrated in FIG. 13.

FIG. 16 is a schematic cross-sectional view illustrating a fifth mask process of the organic light-emitting display device 2.

Referring to FIG. 16, the pixel electrode 117-2 and the upper electrode 317 may be simultaneously formed of the same material on a result of the fourth mask process according to an identical mask process. The pixel electrode 117-2 may be formed on a portion of the second insulation layer 13 that is within the first hole C11, and the upper electrode 317 may be formed on a portion of the first insulation layer 13 that is within the second hole C2 of the capacitor region.

Figure 17:
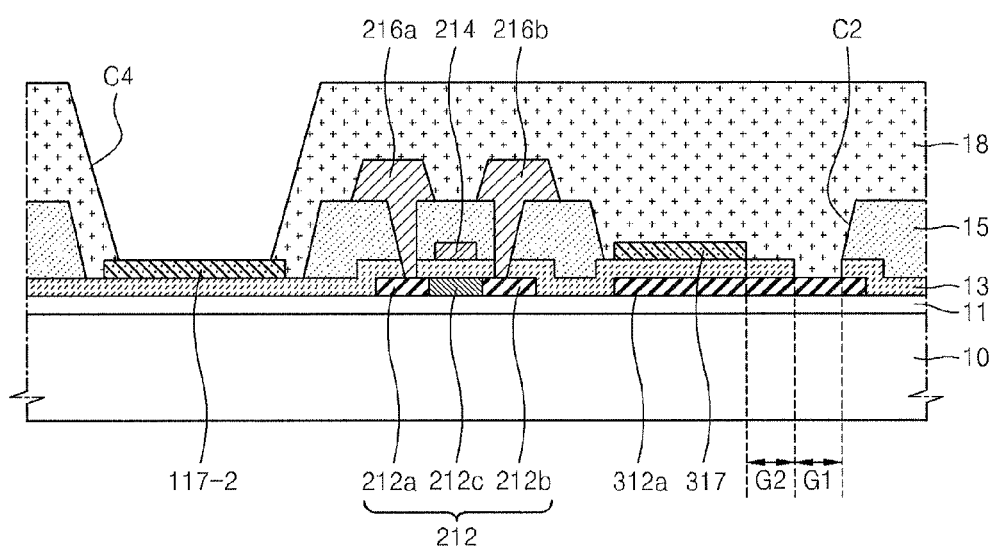
FIG. 17 is a schematic cross-sectional view illustrating a sixth mask process of the organic light-emitting display device illustrated in FIG. 13.

FIG. 17 is a schematic cross-sectional view illustrating a sixth mask process of the organic light-emitting display device 2.

Referring to FIG. 17, the third insulation layer 18 may be patterned to form a fourth hole C4 through which the upper surface of the pixel electrode 117-2 is exposed.

By way of summation and review, a substrate of a flat panel display typically includes a TFT, a capacitor, wiring, and the like formed thereon in a fine pattern, which is typically formed by photo-lithography where a pattern is transferred using a mask.

According to photo-lithography, a photoresist is uniformly coated on a substrate on which a pattern is to be formed, and is exposed using exposure equipment such as a stepper, and a photosensitized photoresist (in the case of a positive photoresist) is then developed. After the photosensitized photoresist is developed, the pattern on the substrate is etched using remaining photoresist, and unnecessary photoresist after the formation of the pattern is removed.

In such a process of transferring a pattern by using a mask, a mask on which a desired pattern is drawn is first prepared. Thus, as the number of processes using a mask increases, the manufacturing costs for preparing for the use of masks may increase. Moreover, the manufacturing process may be complicated due to the above-described complicated processes and a manufacturing time may be increased, leading to an increase in manufacturing costs.

Embodiments described herein provide a thin-film transistor (TFT) array substrate that is easily manufactured and performs smooth signal transmission, an organic light-emitting display device including the TFT array substrate, and a method of manufacturing the TFT array substrate A TFT array substrate, an organic light-emitting display device including the TFT array substrate, and a method of manufacturing the TFT array substrate according to the embodiments as described above may provide the following effects:

Undoping or lack of doping of ion impurities in a lower electrode of a capacitor and a wiring region may be prevented. Accordingly, electrostatic capacitance of a capacitor may be increased and signal transmission of a capacitor wiring may be improved.

An upper electrode may be spaced by a predetermined interval from a region on the lower electrode where no insulation layer is formed. Accordingly, leakage current between the upper electrode and the lower electrode may be prevented from occurring due to a silicon-metal compound.

An MIM CAP structure having a high electrostatic capacitance may be provided.

An organic light-emitting display device as described above may be manufactured using six mask processes.

While the embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. A thin-film transistor (TFT) array substrate, comprising:
    an active layer of a TFT disposed on a substrate and a lower electrode of a capacitor disposed on a same level as the active layer;
    a first insulation layer disposed on the active layer and the lower electrode and having a first gap exposing an area of the lower electrode;
    a gate electrode of the TFT disposed on the first insulation layer, and an upper electrode of the capacitor disposed on the lower electrode and the first insulation layer, the upper electrode of the capacitor having a second gap that exposes the first gap and a portion of the first insulation layer;
    a source electrode and a drain electrode electrically connected to source and drain regions of the active layer;
    a second insulation layer disposed between the gate electrode and the source electrode and between the gate electrode and the drain electrode, wherein the second insulation layer is not disposed on the upper electrode of the capacitor, in the first gap of the first insulation layer, or in the second gap of the upper electrode;
    a pixel electrode connected to the source electrode or the drain electrode; and
    a third insulation layer that covers the source electrode and the drain electrode and exposes the pixel electrode.

2. The TFT array substrate of claim 1, wherein the active layer and the lower electrode include a semiconductor material doped with ion impurities.

3. The TFT array substrate of claim 1, wherein the upper electrode includes a same material as a material used to form the pixel electrode.

4. The TFT array substrate of claim 3, wherein the upper electrode and the pixel electrode include a transparent conductive material.

5. The TFT array substrate of claim 4, wherein the transparent conductive material includes at least one of indium tin oxide (ITO), indium zinc oxide (IZO), zinc oxide (ZnO), indium oxide ($In_2O_3$), indium gallium oxide (IGO), and aluminum zinc oxide (AZO).

6. The TFT array substrate of claim 1, wherein the pixel electrode is disposed on the second insulation layer.

7. The TFT array substrate of claim 1, wherein the second insulation layer includes a hole by which the pixel electrode is exposed, and the pixel electrode is disposed in the hole on the first insulation layer.

8. The TFT array substrate of claim 1, wherein an etch rate of the source electrode and the drain electrode is different from an etch rate of the upper electrode and the pixel electrode.

9. The TFT array substrate of claim 1, wherein the third insulation layer is disposed on the upper electrode, in the first gap of the first insulation layer, and in the second gap of the lower electrode.

10. The TFT array substrate of claim 1, wherein the first insulation layer and the second insulation layer are inorganic insulation layers.

11. The TFT array substrate of claim 1, wherein the third insulation layer is an organic insulation layer.

12. The TFT array substrate of claim 1, wherein a wiring and a wiring connecting unit connected to the lower electrode on a same level as the lower electrode are positioned at the lower electrode.

13. The TFT array substrate of claim 12, wherein the wiring and the wiring connecting unit include a semiconductor material doped with ion impurities.

14. An organic light-emitting display device, comprising:
    an active layer of a thin-film transistor (TFT) disposed on a substrate and a lower electrode of a capacitor disposed at a same level as the active layer on the substrate;
    a first insulation layer disposed on the active layer and the lower electrode and having a first gap exposing an area of the lower electrode;
    a gate electrode of the TFT disposed on the first insulation layer, and an upper electrode of the capacitor disposed on the lower electrode and the first insulation layer, the upper electrode of the capacitor having a second gap that exposes a portion of the first insulation layer and the first gap;
    a source electrode and a drain electrode electrically connected to source and drain regions of the active layer;
    a second insulation layer disposed between the gate electrode and the source electrode and between the gate electrode and the drain electrode, wherein the second insulation layer is not disposed on the upper electrode of the capacitor, in the first gap of the first insulation layer or in the second gap of the upper electrode;
    a pixel electrode connected to the source electrode or the drain electrode;
    a third insulation layer that covers the source electrode and the drain electrode and exposes the pixel electrode;
    an organic emission layer disposed on the pixel electrode; and
    a counter electrode disposed on the organic emission layer.

15. The organic light-emitting display device of claim 14, wherein the counter electrode is a reflective electrode that reflects light emitted from the organic emission layer.

16. A method of manufacturing a TFT array substrate, the method comprising:

a first mask process of forming a semiconductor layer on a substrate and patterning the semiconductor layer to form an active layer of a TFT and a lower electrode of a capacitor;

a second mask process of forming a first insulation layer, stacking a first metal on the first insulation layer, and patterning the first metal to form a gate electrode of the TFT and an etch stop layer of the capacitor with a first gap in an area of the lower electrode;

a third mask process of forming a second insulation layer to have contact holes by which a source region and a drain region of the active layer are exposed and by which the etch stop layer and the first gap are exposed;

a fourth mask process of forming a second metal on a result of the third mask process, patterning the second metal to form a source electrode and a drain electrode respectively connected to the source region and the drain region, and removing the first metal and the etch stop layer without removing the source and drain electrodes; and a fifth mask process of forming a third metal on a result of the fourth mask process and patterning the third metal to form a pixel electrode and to form an upper electrode on the first insulation layer, the upper electrode including a second gap that exposes the first insulating layer and the first gap; and a sixth mask process of forming a third insulation layer and patterning the third insulation layer to expose the pixel electrode.

17. The method of claim 16, wherein in the first mask process, a wiring is formed together with the lower electrode to be on a same level as the lower electrode at the lower electrode, by patterning the semiconductor layer.

18. The method of claim 17, wherein, after the second mask process, the source and drain regions and the wiring are doped with ion impurities.

19. The method of claim 16, wherein, in the third mask process, when the second insulation layer is etched, the first insulation layer is also etched to have the first gap.

20. The method of claim 16, wherein, the fourth mask process includes a first etch process of etching the second metal, and a second etch process of etching the etch stop layer.

21. The method of claim 16, wherein, in the fourth mask process, the second metal is a same material as the etch stop layer, and the second metal and the etch stop layer are simultaneously etched.

22. The method of claim 16, wherein, after the fourth mask process, the lower electrode is doped with ion impurities.

23. The method of claim 16, wherein, in the fifth mask process, the pixel electrode is formed on the second insulation layer at a same time that the upper electrode is formed.

24. The method of claim 16, wherein:
in the third mask process, a hole is formed in a portion of the first insulation layer that is outside the TFT, and
in the fifth mask process, the pixel electrode is formed simultaneously with the upper electrode on the first insulation layer in the hole.

* * * * *